United States Patent
Han et al.

(10) Patent No.: US 12,335,694 B2
(45) Date of Patent: Jun. 17, 2025

(54) SINGLE-END-TO-DIFFERENTIAL MICROPHONE CIRCUIT AND ELECTRONIC EQUIPMENT

(71) Applicant: AAC ACOUSTIC TECHNOLOGIES (SHENZHEN) CO., LTD., Shenzhen (CN)

(72) Inventors: Dong Han, Singapore (SG); Chuationg Kee, Singapore (SG)

(73) Assignee: AAC ACOUSTIC TECHNOLOGIES (SHENZHEN) CO., LTD., Shenzhen (CN)

(*) Notice: Subject to any disclaimer, the term of this patent is extended or adjusted under 35 U.S.C. 154(b) by 0 days.

(21) Appl. No.: 17/918,895

(22) PCT Filed: May 20, 2022

(86) PCT No.: PCT/CN2022/094173
§ 371 (c)(1),
(2) Date: Oct. 13, 2022

(87) PCT Pub. No.: WO2023/201829
PCT Pub. Date: Oct. 26, 2023

(65) Prior Publication Data
US 2025/0039600 A1 Jan. 30, 2025

(30) Foreign Application Priority Data
Apr. 19, 2022 (CN) .......................... 202210410729.0

(51) Int. Cl.
H04R 3/00 (2006.01)
H03F 1/26 (2006.01)
H03F 3/45 (2006.01)

(52) U.S. Cl.
CPC ................ H04R 3/00 (2013.01); H03F 1/26 (2013.01); H03F 3/45479 (2013.01)

(58) Field of Classification Search
CPC ........ H04R 3/00; H04R 19/016; H04R 19/04; H04R 17/02; H04R 3/005; H04R 3/10; H04R 2203/00; H03F 1/26; H03F 3/45479
(Continued)

(56) References Cited

U.S. PATENT DOCUMENTS

| | | | | |
|---|---|---|---|---|
| 4,335,274 A | * | 6/1982 | Ayers | ...................... H04R 3/002 381/121 |
| 8,374,363 B2 | * | 2/2013 | Onishi | .................... H03F 3/187 381/91 |

(Continued)

FOREIGN PATENT DOCUMENTS

CN 110138346 B * 9/2020 .......... A61B 5/7203

*Primary Examiner* — Xu Mei
(74) *Attorney, Agent, or Firm* — Wiersch Law Group

(57) ABSTRACT

The present invention provides a single-end-to-differential microphone circuit and an electronic equipment, including: an amplifier, a microphone connected to the positive input end of the amplifier, a coupling capacitor $C_{AC}$ connected to the negative input end of the amplifier, a first feedback capacitor $C_{FB1}$ connected to the negative output end of the amplifier, a first feedback resistor $R_{FB1}$ connected in parallel with the first feedback capacitor $C_{FB1}$, a second feedback capacitor connected to the positive output end of the amplifier $C_{FB2}$, and a second feedback resistor $R_{FB2}$ connected in parallel with the second feedback capacitor $C_{FB1}$. The circuit of the present invention can adopt a microphone structure with smaller capacity, and at the same time has a better system signal to noise ratio.

8 Claims, 3 Drawing Sheets

(58) Field of Classification Search
USPC .................. 381/91, 92, 111–115, 120–122
See application file for complete search history.

(56) References Cited

U.S. PATENT DOCUMENTS

| | | | |
|---|---|---|---|
| 9,634,628 B2* | 4/2017 | Nicollini | H03F 3/45475 |
| 10,432,242 B1* | 10/2019 | Terry | H04B 1/12 |
| 2015/0016635 A1* | 1/2015 | Haas-Christensen | H04R 19/016 |
| | | | 381/121 |
| 2020/0162099 A1* | 5/2020 | Perrott | H03M 1/188 |

* cited by examiner

SINGLE-END-TO-DIFFERENTIAL MICROPHONE CIRCUIT AND ELECTRONIC EQUIPMENT

TECHNICAL FIELD

The invention relates to the field of electronic technology, in particular to a single-end-to-differential microphone circuit and an electronic equipment.

BACKGROUND ART

The microphone circuit generally has two modes of single-ended output and differential output. Wherein, the noise of the single-ended output is relatively large, and the differential output can filter out the noise better.

The traditional single-ended to differential circuit is shown in FIG. 1. When the closed loop gain is set to 1, $C_{DMY}=C_{MEMS}=C_{FB}$ in the circuit is required, with the development of the microphone technology, the equivalent capacitor $C_{MEMS}$ of the microphone are getting smaller and smaller. In this way, in order to maintain the closed loop gain as 1, the size of the feedback capacitor $C_{FB}$ also needs to be reduced accordingly However, the signal to noise ratio is highly sensitive to the change of feedback capacitor $C_{FB}$, if the feedback capacitor $C_{FB}$ becomes smaller, the signal-to-noise ratio at the output end will become worse. In addition, the high voltage terminal $V_{HCM}$ is the AC ground, and the AC signal is input at the $V_{INP}$ terminal. When the vibration amplitude of the input signal is large, the common mode voltage $V_{IN,CM}$ of the input end $V_{INP}$ and $V_{INN}$ will have a large vibration amplitude. The vibration amplitude of $V_{IN,CM}$ is half of the vibration amplitude of the end $V_{OUTP}$. Therefore, the amplifier AMP must use an amplifier with input common mode voltage of a large range.

SUMMARY OF THE INVENTION

The purpose of the present invention is to provide a single-end-to-differential microphone circuit and an electronic equipment for solving the above technical problems.

For achieving the object mentioned above, the present invention provides a single-end-to-differential microphone circuit, including: an amplifier; a microphone connected to a positive input end of the amplifier; a coupling capacitor CAC connected to a negative input end of the amplifier; a first feedback capacitor CFB1 connected to the negative output end of the amplifier; a first feedback resistor RFB1 connected in parallel with the first feedback capacitor CFB1; a second feedback capacitor connected to the positive output end of the amplifier CFB2; and a second feedback resistor RFB2 connected in parallel with the second feedback capacitor CFB1.

The microphone and an input end of the coupling capacitor are connected to a bias resistor RB which enables an AC signal to be input at the positive input end and the negative input end of the amplifier at the same time.

In addition, a capacity of the coupling capacitor CAC is at least 4 times that of the microphone.

In addition, the amplifier includes: a p-type input transistor M1, a p-type input transistor M2, a n-type input transistor M3, a n-type input transistor M4, and an output load; source electrodes of the p-type input transistor M1 and the p-type input transistor M2 are connected to the bias current IB'; grid electrodes of the p-type input transistor M1 and p-type input transistor M2 are respectively connected to the positive input end and the negative input end of the amplifier; the n-type input transistor M3 and the n-type input transistor M4 are respectively connected to the drain electrodes of the p-type input transistor M1 and the p-type input transistor M2; grid electrodes of the n-type input transistor M3 and the n-type input transistor M4 are respectively connected to the positive input end and the negative input end of the amplifier; and source electrodes of the n-type input transistor M3 and the n-type input transistor M4 are respectively connected to the output loads.

In addition, the output loads are a load transistor M5 and load transistor M6; the grid electrodes of the load transistor M5 and the load transistor M6 are respectively connected to the drain electrodes of the p-type input transistor M1 and p-type input transistor M2; the drain electrodes of the load transistor M5 and the load transistor M6 are respectively connected to the source electrodes of the n-type input transistor M3 and n-type input transistor M4; the transconductances of the p-type input transistor M1, p-type input transistor M2, n-type input transistor M3, and n-type input transistor M4 are added together, then the transconductance is converted into voltage through the load transistor M5 and load transistor M6 and output at the output end.

In addition, an equivalent capacity of the microphone is less than 2 pF.

The present invention further provides an electronic equipment including a single-end-to-differential microphone circuit, wherein the single-end-to-differential microphone circuit includes: an amplifier; a microphone connected to a positive input end of the amplifier; a coupling capacitor CAC connected to a negative input end of the amplifier; a first feedback capacitor CFB1 connected to a negative output end of the amplifier; a first feedback resistor RFB1 connected in parallel with the capacitor CFB1, a second feedback capacitor CFB2 connected to the positive output end of the amplifier, and a second feedback resistor RFB2 connected in parallel with the second feedback capacitor CFB1. The microphone and the input end of the coupling capacitor are connected to a bias resistor RB which enables the AC signal to be input at the positive input end and the negative input end of the amplifier at the same time.

Compared with the related art, the present invention maintains high impeder at both ends of the microphone $C_{MEMS}$ by introducing a bias resistor and combining with a feedback resistor, and the two ends of the coupling capacitor $C_{AC}$ are also high impeder, therefore, the AC signal can be input at both ends of $V_{INP}$ and $V_{INN}$ of the amplifier. The coupling capacitor $C_{AC}$ will enter the $V_{INN}$ after AC coupling to the input signal, the microphone $C_{MEMS}$ itself finds a balance of communication internally. When the closed loop gain is 1, $C_{FB}=2C_{MEMS}$, thus, the feedback capacitor $C_{FB}$ can be doubled in size relative to $C_{MEMS}$, which can filter out more noise of the amplifier itself and improve the signal to noise ratio of the whole system.

In an embodiment, because the AC signal can be input from the positive and negative input end $V_{INP}$ and $V_{INN}$ at the same time, the vibration amplitude of the common mode voltage $V_{IN,CM}$ at the input end will be significantly reduced, ideally even zero. Therefore, the amplifier (current-reuse amp, cr-amp) of current sharing type with a smaller input range of common mode voltage can be used.

In an embodiment, the input end of cr-amp can obtain the transconductance of p-type and n-type input at the same current bias, the input transconductance is approximately doubled, thereby reducing the noise of the amplifier and improving the signal to noise ratio of the entire system.

DETAILED DESCRIPTION OF EXEMPLARY EMBODIMENT

The present disclosure will hereinafter be described in detail with reference to exemplary embodiments. To make the technical problems to be solved, technical solutions and beneficial effects of the present disclosure more apparent, the present disclosure is described in further detail together with the figures and the embodiments. It should be understood the specific embodiments described hereby are only to explain the disclosure, not intended to limit the disclosure.

Embodiment 1

Figure 1:
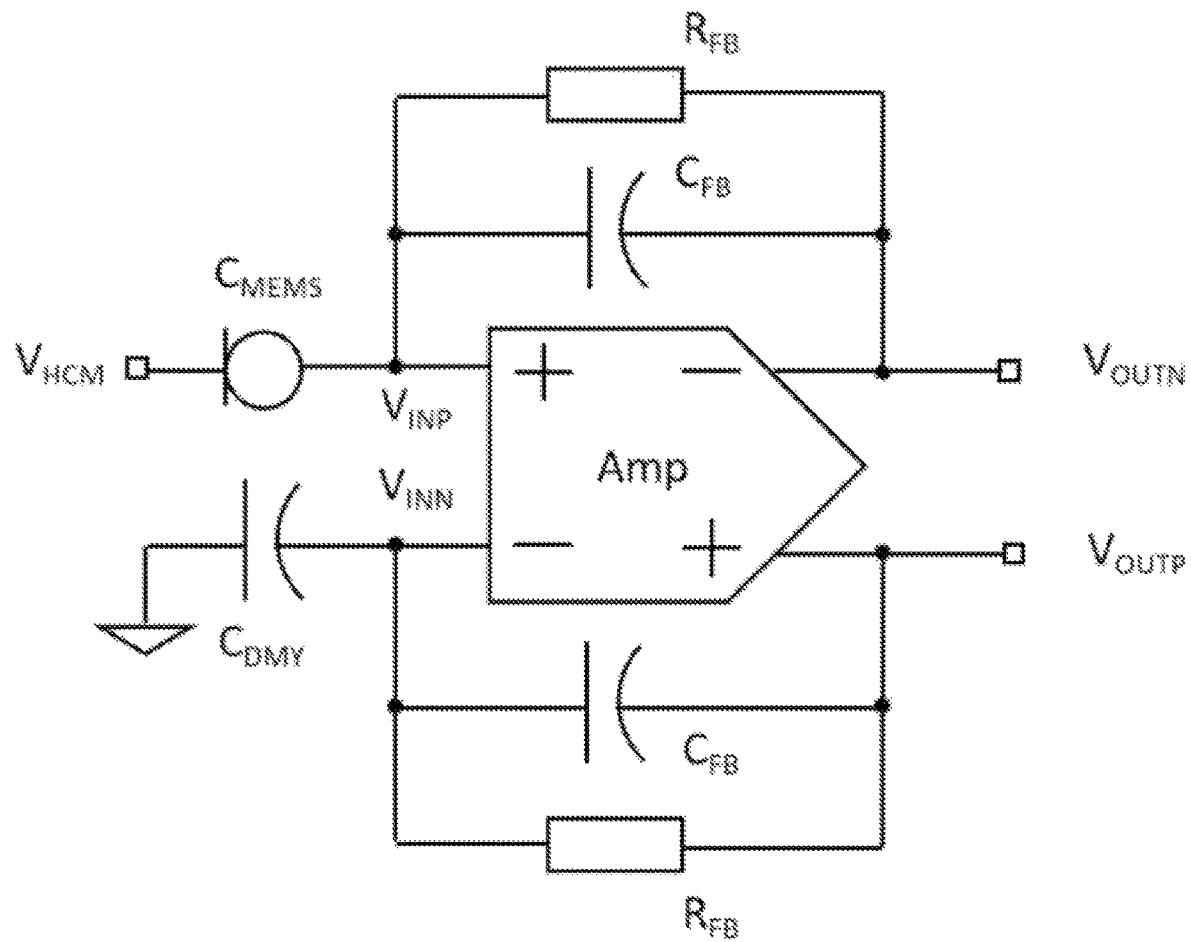
FIG. 1 is an existing circuit principle of a single-end-to-differential microphone circuit.
Figure 2:
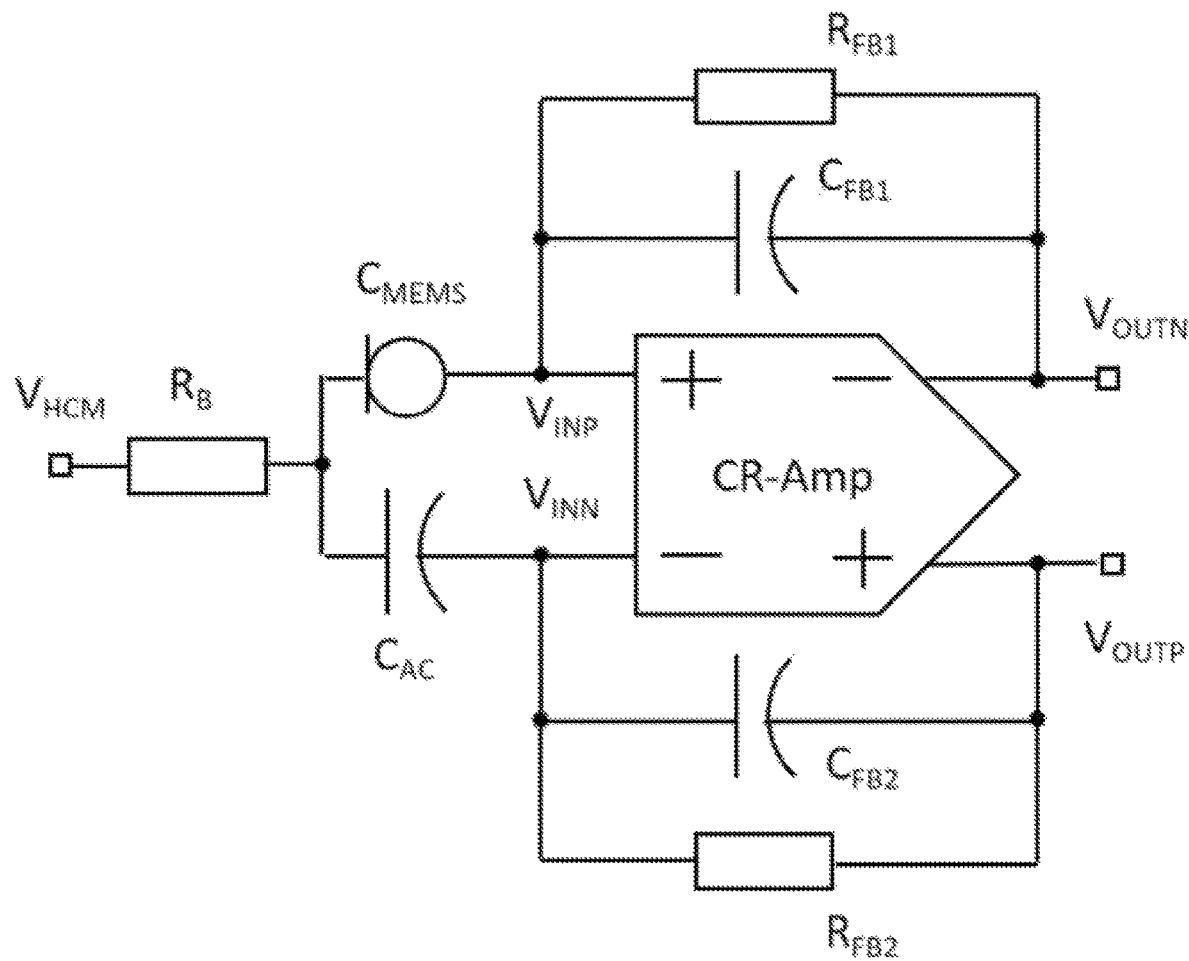
FIG. 2 is a circuit principle of a single-end-to-differential microphone circuit in an embodiment of the present invention.
Figure 3:
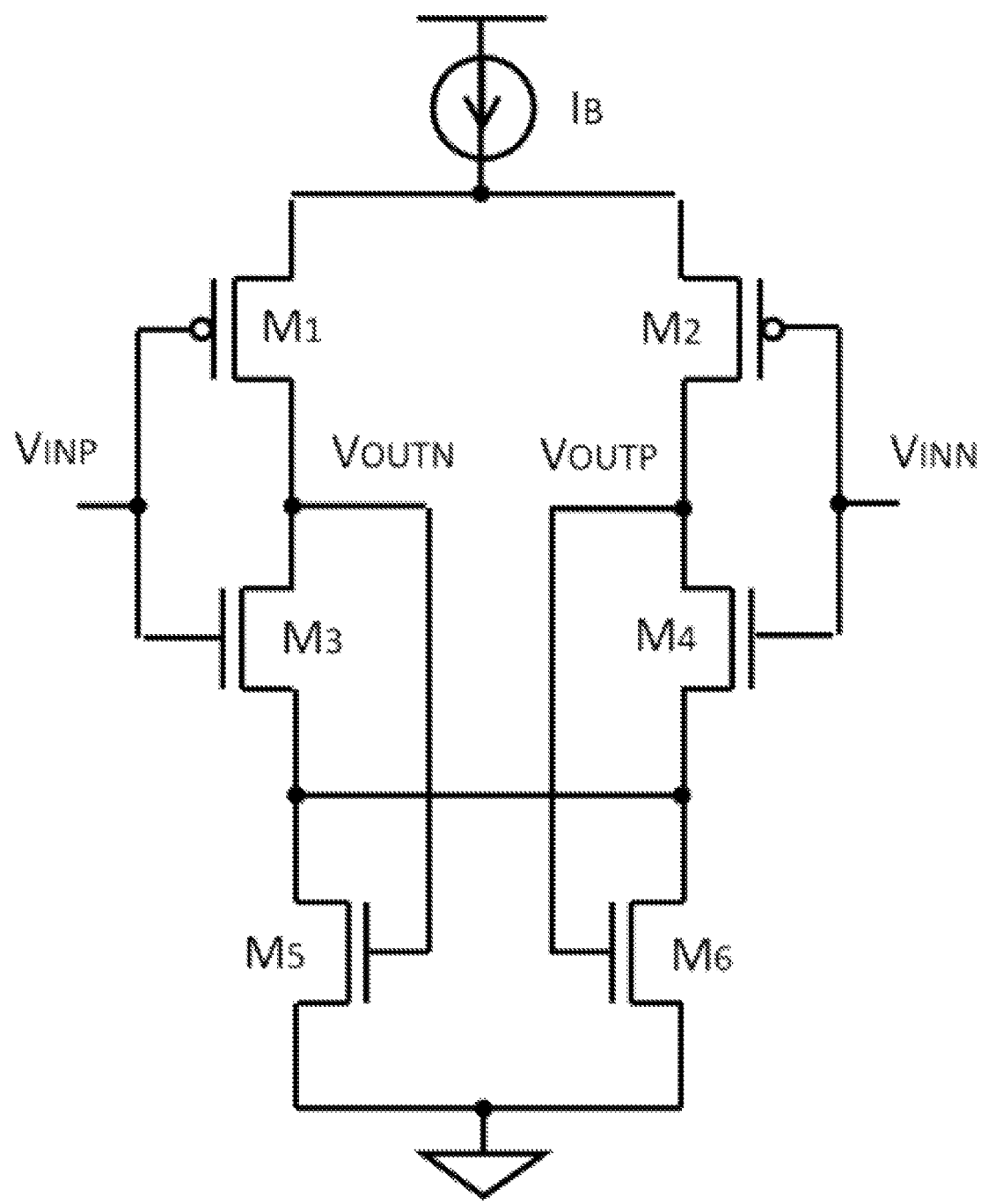
FIG. 3 is a circuit principle view of an amplifier in the embodiment of the present invention.

Please refer to FIG. 1, the present invention provides a single-end-to-differential microphone circuit, including: an amplifier CR-Amp, a microphone $C_{MEMS}$ connected to positive input end $V_{INP}$ of the amplifier CR-Amp a coupling capacitor $C_{AC}$ connected to negative input end $V_{INN}$ of the amplifier CR-Amp, a first feedback capacitor $C_{FB1}$ connected to the negative output end $V_{OUTN}$ of the amplifier, a first feedback resistor $R_{FB1}$ connected in parallel with the first feedback capacitor $C_{FB1}$, a second feedback capacitor $C_{FB2}$ connected to the positive output end $V_{OUTP}$ of the amplifier, and a second feedback resistor $R_{FB2}$ connected in parallel with the second feedback capacitor $C_{FB1}$. The input ends of the microphone $C_{MEMS}$ and the coupling capacitor $C_{AC}$ are connected to a bias resistor $R_B$. The bias resistor $R_B$ enables the AC signal to be input at the positive input end and the negative input end of the amplifier at the same time.

In this embodiment, the capacitor size of the coupling capacitor $C_{AC}$ is at least 4 times that of the microphone, which is used to isolate the high voltage DC voltage at the $R_B$ end, and avoid the negative input end of the amplifier from being connected to the high voltage DC voltage, in turn the entire circuit is affected. $V_{HCM}$ is the high voltage bias voltage of 13.8v.

In this embodiment, the amplifier includes: a p-type input transistor M1, a p-type input transistor M2, a n-type input transistor M3, n-type input transistor M4, and an output load. The source electrodes of the p-type input transistor M1 and the p-type input transistor M2 are connected to the bias current IB. The grid electrodes of the p-type input transistor M1 and p-type input transistor M2 are respectively connected to the positive input end and the negative input end of the amplifier. The n-type input transistor M3 and the n-type input transistor M4 are respectively connected to the drain electrodes of the p-type input transistor M1 and the p-type input transistor M2. The grid electrodes of the n-type input transistor M3 and the n-type input transistor M4 are respectively connected to the positive input end and the negative input end of the amplifier. The source electrodes of the n-type input transistor M3 and the n-type input transistor M4 are respectively connected to output load.

In this embodiment, the output loads are load transistor M5 and load transistor M6. The grid electrodes of the load transistor M5 and the load transistor M6 are respectively connected to the drain electrodes of the p-type input transistor M1 and p-type input transistor M2. The drain electrodes of the load transistor M5 and the load transistor M6 are respectively connected to the source electrodes of the n-type input transistor M3 and the n-type input transistor M4. The transconductances of the p-type input transistor M1, p-type input transistor M2, n-type input transistor M3, and n-type input transistor M4 are added together, then the transconductance is converted into voltage through the load transistor M5 and load transistor M6 and output at the output end.

Under the same bias current, the amplifier of this embodiment doubles its transconductance and reduces the noise. The range of input common mode voltage of the amplifier in this embodiment is relatively small. However, since in this embodiment, the AC signal can be input from the positive negative input end $V_{INP}$, $V_{INN}$ at the same time, the vibration amplitude of the common mode voltage $V_{IN,CM}$ at the input end will be significantly reduced. Ideally zero, therefore, the entire circuit can use the amplifier structure in this embodiment.

In this embodiment, based on its smaller requirements for feedback capacitor, the equivalent capacity $C_{MEMS}$ of the microphone is less than 2 pf.

Compared with the related art, the present invention maintains high impeder at both ends of the microphone $C_{MEMS}$ by introducing a bias resistor and combining with a feedback resistor, and the two ends of the coupling capacitor $C_{AC}$ are also high impeder, therefore, the AC signal can be input at both ends of $V_{INP}$ and $V_{INN}$ of the amplifier. The coupling capacitor $C_{AC}$ will enter the $V_{INN}$ after AC coupling to the input signal, the microphone $C_{MEMS}$ itself finds a balance of communication internally. When the closed loop gain is 1, $C_{FB}=2C_{MEMS}$, thus, the feedback capacitor $C_{FB}$ can be doubled compared to the microphone capacitor $C_{MEMS}$, which can filter out more noise of the amplifier itself and improve the signal to noise ratio of the whole system.

In an embodiment, because the AC signal can be input from the positive and negative input end $V_{INP}$ and $V_{INN}$ at the same time, the vibration amplitude of the common mode voltage $V_{IN,CM}$ at the input end will be significantly reduced, ideally even zero. Therefore, the amplifier (current-reuse amp, cr-amp) of current sharing type with a smaller input range of common mode voltage can be used.

In an embodiment, the input end of cr-amp can obtain the transconductance of p-type and n-type input at the same current bias, the input transconductance is approximately doubled, thereby reducing the noise of the amplifier and improving the signal to noise ratio of the entire system.

Embodiment 2

The present invention provides an electronic equipment, which can be smart devices such as a mobile phone, a music player, and a computer. These electronic equipment include a single-end-to-differential microphone circuit, the single-end-to-differential microphone circuit includes: an amplifier CR-Amp, a microphone $C_{MEMS}$ connected to positive input end $V_{INP}$ of the amplifier CR-Amp, a coupling capacitor $C_{AC}$ connected to the negative input end $V_{INN}$ of the amplifier CR-Amp, a first feedback capacitor $C_{FB1}$ connected to the negative output end of the amplifier $V_{OUTN}$, a first feedback resistor $R_{FB1}$ connected in parallel with the first feedback capacitor $C_{FB1}$, a second feedback capacitor $C_{FB2}$ connected to the positive output end of the amplifier $V_{OUTP}$, and a second feedback resistor $R_{FB2}$ connected in parallel with the second feedback capacitor $C_{FB1}$. The input ends of the microphone $C_{MEMS}$ and the coupling capacitor $C_{AC}$ are connected to a bias resistor $R_B$. The bias resistor $R_B$ enables the AC signal to be input at the positive input end and the negative input end of the amplifier at the same time.

In this embodiment, the capacity of coupling capacitor $C_{AC}$ is at least 4 times that of the microphone, which is used to isolate the high voltage DC voltage at the $R_B$ end. In this way, the access of the high voltage DC voltage to the negative input end of the amplifier is avoided, which in turn affects the entire circuit. $V_{HCM}$ is the high voltage bias voltage of 13.8v.

In this embodiment, the amplifier includes: a p-type input transistor M1, a p-type input transistor M2, a n-type input transistor M3, n-type input transistor M4, and an output load. The source electrodes of the p-type input transistor M1 and the p-type input transistor M2 are connected to the bias current IB. The grid electrodes of the p-type input transistor M1 and p-type input transistor M2 are respectively connected to the positive input end and the negative input end of the amplifier. The n-type input transistor M3 and the n-type input transistor M4 are respectively connected to the drain electrodes of the p-type input transistor M1 and the p-type input transistor M2. The grid electrodes of the n-type input transistor M3 and the n-type input transistor M4 are respectively connected to the positive input end and the negative input end of the amplifier. The source electrodes of the n-type input transistor M3 and the n-type input transistor M4 are respectively connected to the output loads.

In this embodiment, the output loads are load transistor M5 and load transistor M6. The grid electrodes of the load transistor M5 and the load transistor M6 are respectively connected to the drain electrodes of the p-type input transistor M1 and p-type input transistor M2. The drain electrodes of the load transistor M5 and the load transistor M6 are respectively connected to the source electrodes of the n-type input transistor M3 and the n-type input transistor M4. The transconductances of the p-type input transistor M1, p-type input transistor M2, n-type input transistor M3, and n-type input transistor M4 are added together, then the transconductance is converted into voltage through the load transistor M5 and load transistor M6 and output at the output end.

Under the same bias current, the amplifier of this embodiment doubles its transconductance and reduces the noise. Although input working mode voltage range of the amplifier in this embodiment is relatively small, however, because in this embodiment the AC signal can be input from the positive negative input end $V_{INP}$, $V_{INN}$ at the same time vibration amplitude of common mode voltage $V_{IN,CM}$ at the input end will decrease significantly, ideally zero. Therefore, the whole circuit can adopt the amplifier structure in this embodiment.

In this embodiment, based on its smaller requirements for feedback capacitor, the equivalent capacity $C_{MEMS}$ of the microphone is less than 2 pf.

Compared with the related art, the present invention maintains high impeder at both ends of the microphone $C_{MEMS}$ by introducing a bias resistor and combining with a feedback resistor, and the two ends of the coupling capacitor $C_{AC}$ are also high impeder, therefore, the AC signal can be input at both ends of $V_{INP}$ and $V_{INN}$ of the amplifier. The coupling capacitor $C_{AC}$ will enter the $V_{INN}$ after AC coupling to the input signal, the microphone $C_{MEMS}$ itself finds a balance of communication internally. When the closed loop gain is 1, $C_{FB}=2C_{MEMS}$, thus, the feedback capacitor $C_{FB}$ can be doubled in size relative to $C_{MEMS}$, which can filter out more noise of the amplifier itself and improve the signal to noise ratio of the whole system.

In an embodiment, since the AC signal can be input from the positive negative input end $V_{INP}$ and $V_{INN}$ at the same time, The vibration amplitude of the common mode voltage $V_{IN,CM}$ at the input end will decrease significantly, ideally zero. Therefore, the amplifier (current-reuse amp, cr-amp) of current sharing type with a smaller input range of common mode voltage can be used.

In an embodiment, the input end of the CR-Amp can obtain the transconductance input by both the p-type and the n-type at the same current bias. Thus, transconductance is approximately doubled, thereby reducing the noise of the amplifier and improving the signal to noise ratio of the entire system.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A single-end-to-differential microphone circuit, including:
   an amplifier;
   a microphone connected to a positive input end of the amplifier;
   a coupling capacitor $C_{AC}$ connected to a negative input end of the amplifier;
   a first feedback capacitor $C_{FB1}$ connected to a negative output end of the amplifier;
   a first feedback resistor $R_{FB1}$ connected in parallel with the first feedback capacitor $C_{FB1}$;
   a second feedback capacitor $C_{FB2}$ connected to a positive output end of the amplifier;
   a second feedback resistor $R_{FB2}$ connected in parallel with the second feedback capacitor $C_{FB2}$; wherein
   the microphone and an input end of the coupling capacitor $C_{AC}$ are connected to a bias resistor $R_B$ which enables an AC signal to be input at the positive input end and the negative input end of the amplifier at the same time;
   the amplifier includes: a p-type input transistor M1, a p-type input transistor M2, a n-type input transistor M3, a n-type input transistor M4, and an output load;
   source electrodes of the p-type input transistor M1 and the p-type input transistor M2 are connected to a bias current IB;
   grid electrodes of the p-type input transistor M1 and the p-type input transistor M2 are respectively connected to the positive input end and the negative input end of the amplifier;
   the n-type input transistor M3 and the n-type input transistor M4 are respectively connected to drain electrodes of the p-type input transistor M1 and the p-type input transistor M2;
   grid electrodes of the n-type input transistor M3 and the n-type input transistor M4 are respectively connected to the positive input end and the negative input end of the amplifier; and
   source electrodes of the n-type input transistor M3 and the n-type input transistor M4 are respectively connected to the output load.

2. The single-end-to-differential microphone circuit as described in claim 1, wherein a capacity of the coupling capacitor $C_{AC}$ is at least 4 times that of the microphone.

3. The single-end-to-differential microphone circuit as described in claim 1, wherein the output load is a load transistor M5 and a load transistor M6; grid electrodes of the load transistor M5 and the load transistor M6 are respectively connected to the drain electrodes of the p-type input transistor M1 and the p-type input transistor M2; drain electrodes of the load transistor M5 and the load transistor M6 are respectively connected to the source electrodes of the n-type input transistor M3 and the n-type input transistor M4.

4. The single-end-to-differential microphone circuit as described in claim 1, wherein, an equivalent capacity of the microphone is less than 2 pF.

5. An electronic equipment including a single-end-to-differential microphone circuit, wherein the single-end-to-differential microphone circuit includes:
   an amplifier;
   a microphone connected to a positive input end of the amplifier;
   a coupling capacitor $C_{AC}$ connected to a negative input end of the amplifier;
   a first feedback capacitor $C_{FB1}$ connected to a negative output end of the amplifier;
   a first feedback resistor $R_{FB1}$ connected in parallel with the first feedback capacitor $C_{FB1}$,
   a second feedback capacitor $C_{FB2}$ connected to a positive output end of the amplifier,
   and a second feedback resistor $R_{FB2}$ connected in parallel with the second feedback capacitor $C_{FB2}$; and wherein the microphone and the input end of the coupling capacitor $C_{AC}$ are connected to a bias resistor $R_B$ which enables the AC signal to be input at the positive input end and the negative input end of the amplifier at the same time,
   the amplifier includes: a p-type input transistor M1, a p-type input transistor M2, a n-type input transistor M3, a n-type input transistor M4, and an output load;
   source electrodes of the p-type input transistor M1 and the p-type input transistor M2 are connected to a bias current IB, and grid electrodes of the p-type input transistor M1 and the p-type input transistor M2 are respectively connected to the positive input end and the negative input end of the amplifier;
   the n-type input transistor M3 and the n-type input transistor M4 are respectively connected to drain electrodes of the p-type input transistor M1 and the p-type input transistor M2;
   grid electrodes of the n-type input transistor M3 and the n-type input transistor M4 are respectively connected to the positive input end and the negative input end of the amplifier;
   source electrodes of the n-type input transistor M3 and the n-type input transistor M4 are respectively connected to the output load.

6. The electronic equipment as described in claim 5, wherein, a capacitance of the coupling capacitor $C_{AC}$ is at least 4 times that of the microphone.

7. The electronic equipment as described in claim 5, wherein the output load is a load transistor M5 and a load transistor M6;
   grid electrodes of the load transistor M5 and the load transistor M6 are respectively connected to the drain electrodes of the p-type input transistor M1 and the p-type input transistor M2;
   drain electrodes of the load transistor M5 and the load transistor M6 are respectively connected to the source electrodes of the n-type input transistor M3 and the n-type input transistor M4.

8. The electronic equipment as described in claim 5, wherein an equivalent capacitance of the microphone is less than 2 pF.

* * * * *